(12) United States Patent
Chou et al.

(10) Patent No.: US 8,344,524 B2
(45) Date of Patent: Jan. 1, 2013

(54) WIRE BONDING METHOD FOR PREVENTING POLYMER CRACKING

(75) Inventors: Chiu-Ming Chou, Kaohsiung (TW);
Shih-Hsiung Lin, Hsin-Chu (TW);
Mou-Shiung Lin, Hsin-Chu (TW);
Hsin-Jung Lo, Taipei County (TW)

(73) Assignee: Megica Corporation, Hsinchu (TW)

( * ) Notice: Subject to any disclaimer, the term of this patent is extended or adjusted under 35 U.S.C. 154(b) by 1216 days.

(21) Appl. No.: 11/425,155

(22) Filed: Jun. 20, 2006

(65) Prior Publication Data

US 2007/0212869 A1 Sep. 13, 2007

Related U.S. Application Data

(60) Provisional application No. 60/743,426, filed on Mar. 7, 2006.

(51) Int. Cl.
*H01L 29/40* (2006.01)
*H01L 21/44* (2006.01)

(52) U.S. Cl. .......................... 257/784; 257/758; 438/612

(58) Field of Classification Search .................. 257/758, 257/784; 438/612
See application file for complete search history.

(56) References Cited

U.S. PATENT DOCUMENTS

| | | | |
|---|---|---|---|
| 5,266,522 A * | 11/1993 | DiGiacomo et al. | 438/612 |
| 5,384,488 A | 1/1995 | Golshan et al. | |
| 5,969,424 A | 10/1999 | Matsuki et al. | |
| 6,066,877 A | 5/2000 | Williams et al. | |
| 6,187,680 B1 | 2/2001 | Costrini et al. | |
| 6,229,221 B1 | 5/2001 | Kloen et al. | |
| 6,300,234 B1 | 10/2001 | Flynn et al. | |
| 6,365,968 B1 * | 4/2002 | Qian et al. | 257/739 |
| 6,410,435 B1 | 6/2002 | Ryan | |
| 6,515,373 B2 | 2/2003 | Barth | |
| 6,593,222 B2 | 7/2003 | Smoak | |
| 6,602,778 B2 * | 8/2003 | Manning et al. | 438/617 |
| 6,683,380 B2 | 1/2004 | Efland et al. | |
| 6,798,050 B1 | 9/2004 | Homma et al. | |
| 6,800,555 B2 | 10/2004 | Test et al. | |

(Continued)

FOREIGN PATENT DOCUMENTS

TW I249822 2/2006

OTHER PUBLICATIONS

Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.

(Continued)

*Primary Examiner* — James Mitchell
(74) *Attorney, Agent, or Firm* — McDermott Will & Emery LLP

(57) ABSTRACT

This invention provides a wire bonding method, comprising providing an integrated circuit (IC) die having thereon a passivation layer and a plurality of first bonding pads exposed by respective openings in the passivation layer; forming a polymer layer on the passivation layer; forming an adhesive/barrier layer on the polymer layer; forming a metal pad layer on the adhesive/barrier layer; bonding a wire onto the metal pad layer to form a ball bond thereon; and after forming the ball bond on the metal pad layer, running the wire so as to contact the wire with a second bonding pad and forming a wedge bond thereto.

20 Claims, 12 Drawing Sheets

U.S. PATENT DOCUMENTS

| | | | |
|---|---|---|---|
| 6,844,631 | B2 | 1/2005 | Yong et al. |
| 6,927,156 | B2* | 8/2005 | Mathew .................. 438/612 |
| 6,979,647 | B2 | 12/2005 | Bojkov et al. |
| 7,094,676 | B1* | 8/2006 | Leu et al. .................. 438/611 |
| 7,242,099 | B2 | 7/2007 | Lin et al. |
| 7,319,277 | B2* | 1/2008 | Lin .................. 257/781 |
| 7,470,988 | B2* | 12/2008 | Lin et al. .................. 257/759 |
| 2001/0035452 | A1 | 11/2001 | Test et al. |
| 2001/0051426 | A1 | 12/2001 | Pozder et al. |
| 2002/0000671 | A1 | 1/2002 | Zuniga et al. |
| 2002/0043723 | A1* | 4/2002 | Shimizu et al. .................. 257/758 |
| 2003/0062398 | A1* | 4/2003 | Khandros .................. 228/112.1 |
| 2003/0107137 | A1* | 6/2003 | Stierman et al. .................. 257/763 |
| 2004/0070042 | A1 | 4/2004 | Lee et al. |
| 2004/0070086 | A1 | 4/2004 | Lee et al. |
| 2005/0167840 | A1* | 8/2005 | Kothandaraman .................. 257/758 |
| 2006/0055023 | A1* | 3/2006 | Ho et al. .................. 257/692 |
| 2006/0055035 | A1* | 3/2006 | Lin et al. .................. 257/737 |
| 2006/0065967 | A1* | 3/2006 | Lehner .................. 257/698 |
| 2006/0071305 | A1* | 4/2006 | Ho et al. .................. 257/666 |
| 2006/0079028 | A1* | 4/2006 | Takahashi .................. 438/123 |
| 2006/0118927 | A1* | 6/2006 | Verma et al. .................. 257/676 |
| 2006/0163734 | A1* | 7/2006 | Thei et al. .................. 257/758 |
| 2007/0013073 | A1* | 1/2007 | Cabral et al. .................. 257/758 |
| 2007/0026659 | A1* | 2/2007 | Chinthakindi et al. .................. 438/612 |

OTHER PUBLICATIONS

Edelstein, D.C., "Advantages of Copper Interconnects," Proceedings of the 12th International IEEE VLSI Multilevel Interconnection Conference (1995) pp. 301-307.

Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.

Gao, X. et al. "An improved electrostatic discharge protection structure for reducing triggering voltage and parasitic capacitance," Solid-State Electronics, 27 (2003), pp. 1105-1110.

Yeoh, A. et al. "Copper Die Bumps (First Level Interconnect) and Low-K Dielectrics in 65nm High Volume Manufacturing," Electronic Components and Technology Conference (2006) pp. 1611-1615.

Hu, C-K. et al. "Copper-Polyimide Wiring Technology for VLSI Circuits," Materials Research Society Symposium Proceedings VLSI V (1990) pp. 369-373.

Roesch, W. et al. "Cycling copper flip chip interconnects," Microelectronics Reliability, 44 (2004) pp. 1047-1054.

Lee, Y-H. et al. "Effect of ESD Layout on the Assembly Yield and Reliability," International Electron Devices Meeting (2006) pp. 1-4.

Yeoh, T-S. "ESD Effects on Power Supply Clamps," Proceedings of the 6th International Sympoisum on Physical & Failure Analysis of Integrated Circuits (1997) pp. 121-124.

Edelstein, D. et al. "Full Copper Wiring in a Sub-0.25 pm CMOS ULSI Technology," Technical Digest IEEE International Electron Devices Meeting (1997) pp. 773-776.

Venkatesan, S. et al. "A High Performance 1.8V, 0.20 pm CMOS Technology with Copper Metallization," Technical Digest IEEE International Electron Devices Meeting (1997) pp. 769-772.

Jenei, S. et al. "High Q Inductor Add-on Module in Thick Cu/SiLK™ single damascene," Proceedings from the IEEE International Interconnect Technology Conference (2001) pp. 107-109.

Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.

Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.

Kumar, R. et al. "A Family of 45nm IA Processors," IEEE International Solid-State Circuits Conference, Session 3, Microprocessor Technologies, 3.2 (2009) pp. 58-59.

Bohr, M. "The New Era of Scaling in an SoC World," International Solid-State Circuits Conference (2009) Presentation Slides 1-66.

Bohr, M. "The New Era of Scaling in an SoC World," International Solid-State Circuits Conference (2009) pp. 23-28.

Ingerly, D. et al. "Low-K Interconnect Stack with Thick Metal 9 Redistribution Layer and Cu Die Bump for 45nm High Volume Manufacturing," International Interconnect Technology Conference (2008) pp. 216-218.

Kurd, N. et al. "Next Generation Intel® Micro-architecture (Nehalem) Clocking Architecture," Symposium on VLSI Circuits Digest of Technical Papers (2008) pp. 62-63.

Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.

Geffken, R. M. "An Overview of Polyimide Use in Integrated Circuits and Packaging," Proceedings of the Third International Symposium on Ultra Large Scale Integration Science and Technology (1991) pp. 667-677.

Luther, B. et al. "Planar Copper-Polyimide Back End of the Line Interconnections for ULSI Devices," Proceedings of the 10th International IEEE VLSI Multilevel Interconnection Conference (1993) pp. 15-21.

Master, R. et al. "Ceramic Mini-Ball Grid Array Package for High Speed Device," Proceedings from the 45th Electronic Components and Technology Conference (1995) pp. 46-50.

Maloney, T. et al. "Stacked PMOS Clamps for High Voltage Power Supply Protection," Electrical Overstress/Electrostatic Discharge Symposium Proceedings (1999) pp. 70-77.

Lin, M.S. et al. "A New System-on-a-Chip (SOC) Technology—High Q Post Passivation Inductors," Proceedings from the 53rd Electronic Components and Technology Conference (May 30, 2003) pp. 1503-1509.

Megic Corp. "MEGIC way to system solutions through bumping and redistribution," (Brochure) (Feb. 6, 2004) pp. 1-3.

Lin, M.S. "Post Passivation Technology™—MEGIC® Way to System Solutions," Presentation given at TSMC Technology Symposium, Japan (Oct. 1, 2003) pp. 1-32.

Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.

\* cited by examiner

WIRE BONDING METHOD FOR PREVENTING POLYMER CRACKING

CROSS REFERENCE TO RELATED APPLICATIONS

This application claims the benefits of U. S. provisional application No. 60/743,426, filed Mar. 7, 2006.

BACKGROUND OF THE INVENTION

1. Field of the Invention

The present invention relates generally to the field of wire bonding. More particularly, the present invention relates to a ball-wedge bonding process than is capable of preventing polymer such as polyimide cracking.

2. Description of the Prior Art

As known in the art, wire bonding is a technology used to attach a fine wire, usually 1 to 3 mils in diameter, from one connection pad to another, completing the electrical connection in an electronic device. The pads can be bond sites on the semiconductor chip or metallized bond sites on interconnection substrates. Semiconductor die can also be wire bonded to metal lead frames as is done in plastic encapsulated devices.

The methods presently used to wire bond include thermocompression, ultrasonic and thermosonic. Other types of bonding technology such C4 (Controlled Collapsed Chip Connection or Flip Chip) or TAB (Tape Automated Bonding) also have been used in parallel with conventional wire bonding technology. Wire bonding continues to be popular and dominant in the field of bonding technologies in the industry.

In the past, a large proportion of all semiconductor-device field failures were caused by wire bonds and the number of known failure mechanism were quite limited. Through the improvement of bonding technology the reliability of wire bonds is increasing, as is our understanding of the failure modes, though they continue to plague new manufacturing lines.

There are basically two forms of wire bonds. They are wedge bonds and ball bonds. Recent study shows that about 90% of all electronic packages and assemblies are produced using ball bonds and about 10% are produced with wedge bonds. An increase in the use of ball bonding is expected as semiconductor devices increase in functionality and decrease in size causing smaller bond pads and closer bond pad spacing.

The most widely used wire materials are gold (Au) and aluminum (Al), however, silver (Ag) and copper (Cu) are also used. Copper wire (ball bonding) has gained considerable attention due to its economic advantage and strong resistance to sweeping (leaning of the stress relief loop until it touches an adjacent bond wire). Bonding these wire materials to different pad materials creates different metallurgical systems called intermetallics. Gold was the original material used when wire-bonding technology was developing. Aluminum has become popular due to its good electrical performance and lower cost. Gold wire can be bonded in the shape of a wedge or a ball. Ball bonds can be used in very tight spacing.

One method of wire bonding is thermosonic or ball-wedge bonding. The thermosonic bonding is used for Au wires and currently comprises about 90% of all wire bonding. Typically, it is done at temperatures of around 100° C. to 240° C. Bonding is formed when the ultrasonic energy combines with the capillary technique of thermocompression bonding. Occasionally, it is used for Au wedge-wedge bonding, but mostly it is best suited for a ball-wedge bond.

The machine used to make ball-wedge bonds incorporates a "flame-off" arm. At the end of each full bonding cycle an arc is struck between the arm and the end of the wire, producing a ball. The ball is deformed as it is welded to the IC (integrated circuit), the second bond (known as the wedge, capillary-wedge, termination bond or stitch bond) is then made to the substrate.

The prior art ball-wedge bonding technology has a drawback in that during wedge boning on the Au pad of an IC die, stress is exerted on the Au pad and the underlying materials layers, inducing undesirable crack defects in the IC die.

SUMMARY OF THE INVENTION

It is one object of the present invention to provide an improved ball-wedge bonding method to solve the prior art problems.

From one aspect, this invention provides a wire bonding method, comprising providing an integrated circuit (IC) die having thereon a passivation layer and a plurality of first bonding pads exposed by respective openings in the passivation layer; forming a polymer layer on the passivation layer; forming an adhesive/barrier layer on the polymer layer; forming a metal pad layer on the adhesive/barrier layer; bonding a wire onto the metal pad layer to form a ball bond thereon; and after forming the ball bond on the metal pad layer, running the wire so as to contact the wire with a second bonding pad and forming a wedge bond thereto.

From another aspect, this invention provides a wire bonding method, comprising providing an integrated circuit (IC) die having thereon a passivation layer and a plurality of first bonding pads exposed by respective openings in the passivation layer; forming a polymer layer on the passivation layer; forming a Cr layer on the polymer layer; forming a Cu layer on the Cr layer; forming a Ni layer on the Cu layer; forming a Au layer on the Ni layer; bonding a wire onto the Au layer to form a ball bond thereon; and after forming the ball bond on the Au layer, running the wire so as to contact the wire with a second bonding pad and forming a wedge bond thereto.

From another aspect, this invention provides a wire bonding method, comprising providing an integrated circuit (IC) die having thereon a passivation layer and a plurality of first bonding pads exposed by respective openings in the passivation layer; forming a polymer layer on the passivation layer; forming an adhesive/barrier layer on the polymer layer; forming a metal pad layer on the adhesive/barrier layer; bonding a wire onto the metal pad layer to form a wedge bond thereon; and after forming the ball bond on the metal pad layer, running the wire so as to contact the wire with a second bonding pad and forming a ball bond thereto.

From still nother aspect, this invention provides a wire bonding method, comprising providing an integrated circuit (IC) die having thereon a passivation layer and a plurality of first bonding pads exposed by respective openings in the passivation layer; forming a polymer layer on the passivation layer; forming a Cr layer on the polymer layer; forming a Cu layer on the Cr layer; forming a Ni layer on the Cu layer; forming a Au layer on the Ni layer; bonding a wire onto the Au layer to form a wedge bond thereon; and after forming the ball bond on the Au layer, running the wire so as to contact the wire with a second bonding pad and forming a ball bond thereto.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
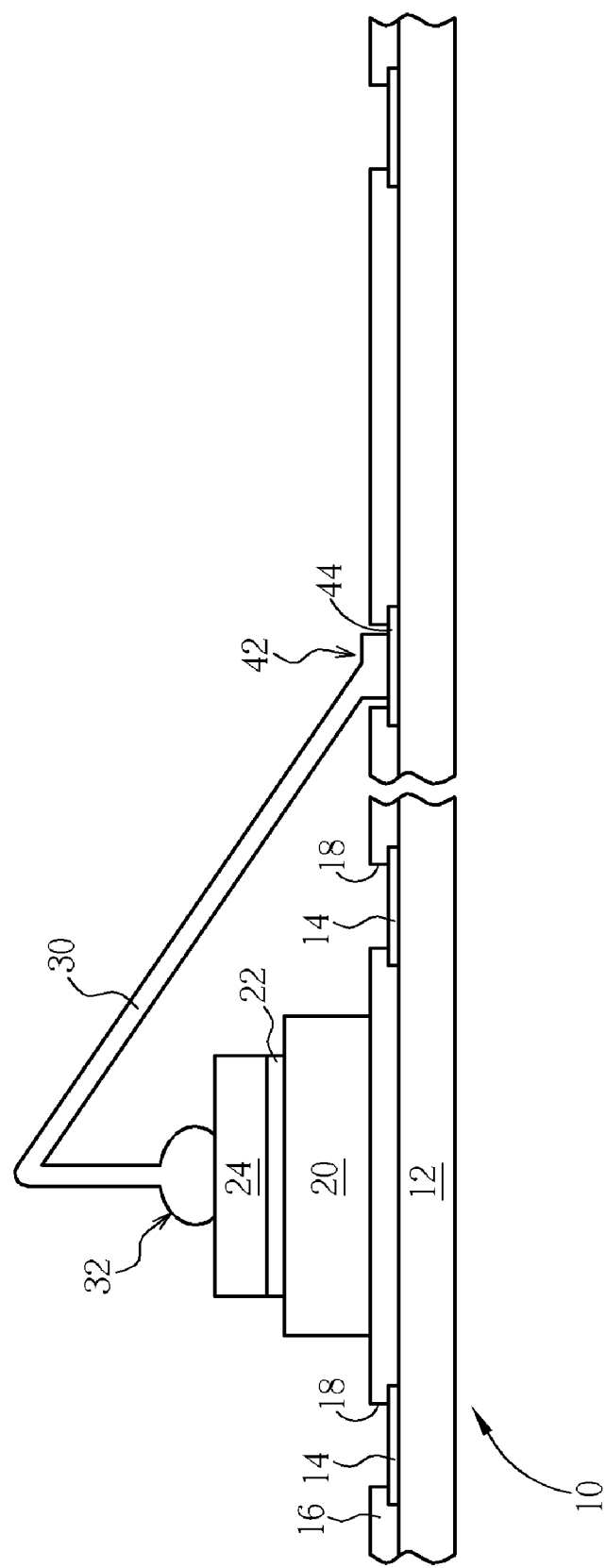
FIG. 1 is a schematic, cross-sectional diagram illustrating the ball-wedge wire bonding with ball bonding on thick polymer layer in accordance with one preferred embodiment of this invention.

Please refer to FIG. 1. FIG. 1 is a schematic, cross-sectional diagram illustrating the ball-wedge wire bonding with ball bonding on thick polymer layer in accordance with the first preferred embodiment of this invention.

As shown in FIG. 1, an integrated circuit (IC) die 10 is provided. The IC die 10 includes active devices and layers of metal interconnection (not shown) that are fabricated in the substrate layer 12. The active devices such as CMOS, BiCMOS devices, transistors, resistors, capacitors, or inductors are fabricated using integrated circuit processes on a semiconductor substrate such as silicon substrate, GaAs substrate or SiGe substrate.

Multiple inter-layer dielectrics such as low-k dielectric materials, silicon oxide, oxy-nitride are deposited over the semiconductor substrate. The layers of metal interconnection are fabricated in the multiple inter-layer dielectrics by a process comprising sputtering an aluminum layer and then patterning the aluminum layer, or by a process comprising electroplating a copper layer in opening in a dielectric layer and on the dielectric layer and then removing the copper layer outside the opening in the dielectric layer using a CMP process.

On the substrate layer 12, a plurality of bonding pads 14 are formed. A portion of the top surface of each bonding pad 14 is exposed through the respective opening 18 formed in a passivation layer 16 that covers the top surface of the substrate layer 12. According to this invention, the bonding pads 14 includes but not limited to sputtered aluminum pads, CVD aluminum pads, electroplated copper pads, and CVD copper pads. The passivation layer 16 comprises silicon nitride, silicon oxide, silicon oxy-nitride and combinations thereof.

To release the stress exerted on the IC die 10 during the wire bonding process, a patterned thick polymer layer 20 such as polyimide (PI), benzocyclobutene (BCB), or any other suitable organic polymer is provided overlying the passivation layer 16. According to the preferred embodiment of this invention, the polymer layer 20 has a thickness that is greater than 3 micrometers, preferably, 3-100 micrometers, more preferably 8-30 micrometers. In practice, for example, the polymer layer 20 has a thickness of about 3, 8, 13, 20, 23, 28 or 33 micrometers.

On the top surface of the polymer layer 20, an adhesive/barrier layer 22 is provided. The adhesive/barrier layer 22 may include TiW, Ti, Ta, TaN, CrCu, TiN, and the like, preferably TiW. According to the preferred embodiment of this invention, the adhesive/barrier layer 22 has a thickness of about 1000 angstroms to 6000 angstroms, for example, 3000 angstroms.

A gold pad 24 is formed on the adhesive/barrier layer 22. According to the preferred embodiment of this invention, the gold pad 24 has a thickness that is greater than 1 micrometer, preferably, 1-50 micrometers, more preferably 2-7 micrometers. In practice, for example, the gold pad 24 has a thickness of about 2, 4, 7 or 10 micrometers.

According to this invention, first, a wire 30 is bonded on the gold pad 24 of the IC die 10 to form a ball bond 32. The wire 30 may comprise gold, aluminum or copper. The ball bonding process performed on the gold pad 24 is known in the art. For example, during gold ball bonding, a gold ball is first formed by melting the end of the wire (which is held by a bonding tool known as a capillary) through electronic flame-off (EFO). This free-air ball typically has a diameter ranging from 1.5 to 2.5 times the wire diameter. The free-air ball is then brought into contact with the bond pad. Adequate amounts of pressure, heat, and ultrasonic forces are then applied to the ball for a specific amount of time, forming the initial metallurgical weld between the ball and the bond pad as well as deforming the ball bond itself into its final shape. According to the preferred embodiment of this invention, in order to avoid over stress on polymer layer 20 and also provide good bonding, the ball bonding force preferably ranges between 200 mg and 500 mg. To prevent polymer cracking problem, the bonding temperature is less than the glass transition point of the polymer layer 20. By doing this, the reduction of the strength of the polymer layer 20 during bonding process can be avoided.

As shown in FIG. 1, the wire 30 is then run to the corresponding bond pad 44, forming a gradual arc or "loop" between the gold pad 24 and the bond pad 44. The bond pad 44 may be formed on the same IC die 10, another die, ceramic substrate, organic substrate, silicon substrate, glass substrate, leadframe or a flexible substrate with only polymer layer. On the bond pad 44, pressure and ultrasonic forces are applied to the wire 30 to form a wedge bond 42. The wirebonding machine or wirebonder breaks the wire in preparation for the next wirebond cycle by clamping the wire and raising the capillary.

It is one salient feature of this invention that the ball bond 32 is formed first and is formed on the gold pad 24 of the IC die 10, and the wedge bond 42 is then formed on the bond pad 44. By doing this, cracking of the polymer layer 20 can be prevented. In one aspect, the polymer layer 20 is thick enough that it can sustain the stress during wire bonding.

Figure 2:
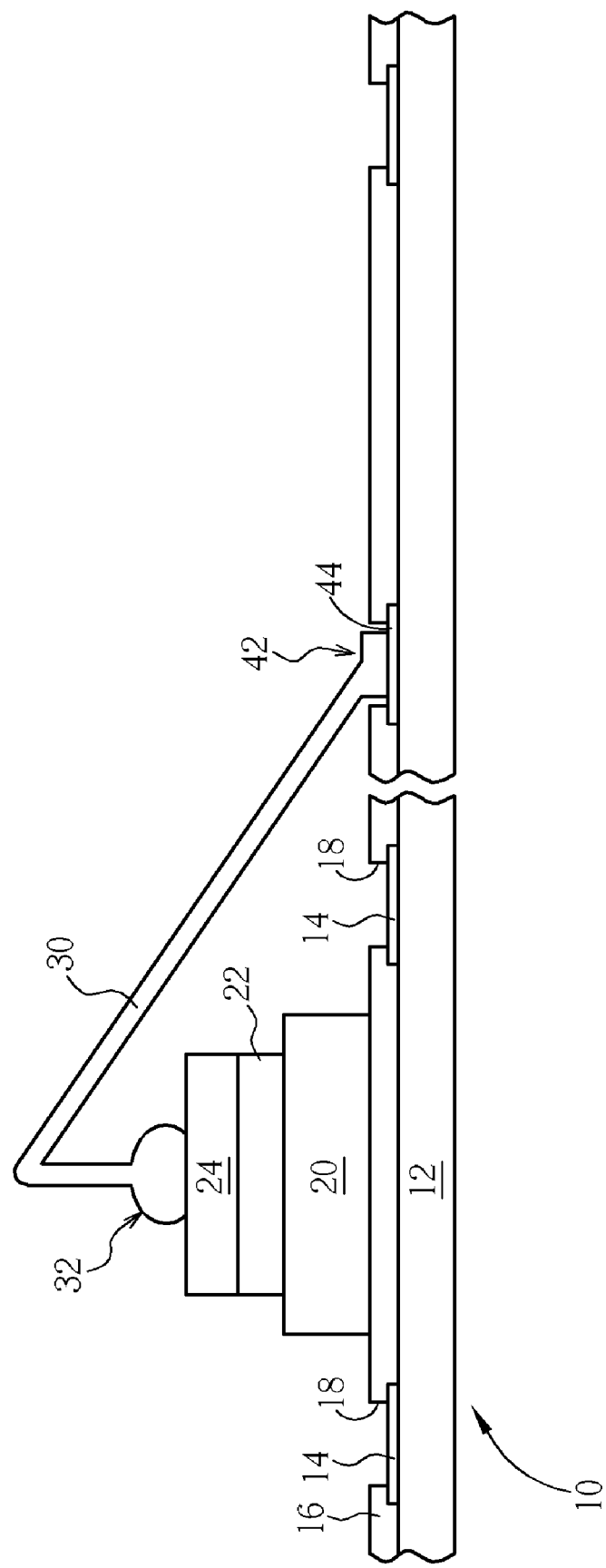
FIG. 2 is a schematic, cross-sectional diagram illustrating the ball-wedge wire bonding with ball bonding on thick adhesive/barrier layer in accordance with another preferred embodiment of this invention.

Please refer to FIG. 2. FIG. 2 is a schematic, cross-sectional diagram illustrating the ball-wedge wire bonding with ball bonding on thick adhesive/barrier layer in accordance with the second preferred embodiment of this invention.

As shown in FIG. 2, likewise, an IC die 10 is provided. The IC die 10 includes active devices and layers of metal interconnection (not shown) that are fabricated in the substrate layer 12. The active devices such as CMOS, BiCMOS devices, transistors, resistors, capacitors, or inductors are fabricated on a semiconductor substrate such as silicon substrate, GaAs substrate or SiGe substrate.

Multiple inter-layer dielectrics such as low-k dielectric materials, silicon oxide, oxy-nitride are deposited over the semiconductor substrate. The layers of metal interconnection are fabricated in the multiple inter-layer dielectrics by a process comprising sputtering an aluminum layer and then patterning the aluminum layer, or by a process comprising electroplating a copper layer in opening in a dielectric layer and on the dielectric layer and then removing the copper layer outside the opening in the dielectric layer using a CMP process.

On the substrate layer 12, a plurality of bonding pads 14 are formed. A portion of the top surface of each bonding pad 14 is exposed through the respective opening 18 formed in a passivation layer 16 that covers the top surface of the substrate layer 12. According to this invention, the bonding pads 14 includes but not limited to sputtered aluminum pads, CVD aluminum pads, electroplated copper pads, and CVD copper pads. The passivation layer 16 comprises silicon nitride, silicon oxide, silicon oxy-nitride and combinations thereof.

A patterned polymer layer 20 such as polyimide (PI), benzocyclobutene (BCB), or any other suitable organic polymer is provided overlying the passivation layer 16. According to the preferred embodiment of this invention, the polymer layer 20 has a thickness that is greater than 3 micrometers, preferably, 3-100 micrometers, more preferably 8-30 micrometers. In practice, for example, the polymer layer 20 has a thickness of about 3, 8, 13, 20, 23, 28 or 33 micrometers.

On the top surface of the polymer layer 20, a thick adhesive/barrier layer 22 is provided. The adhesive/barrier layer 22 may include TiW, Ti, Ta, TaN, Cr, CrCu, TiN, and the like, preferably TiW. According to the preferred embodiment of this invention, the adhesive/barrier layer 22 has a thickness of about 1000 angstroms to 10000 angstroms, preferably, 3000 angstroms to 10000 angstroms, for example, 4000, 6000, 7500 or 9000 angstroms.

A gold pad 24 is formed on the adhesive/barrier layer 22. According to the preferred embodiment of this invention, the gold pad 24 has a thickness that is greater than 1 micrometer, preferably, 1-50 micrometers, more preferably 2-6 micrometers. In practice, for example, the gold pad 24 has a thickness of about 2, 4, 7 or 10 micrometers.

First, a wire 30 is bonded onto the gold pad 24 of the IC die 10 to form a ball bond 32. The wire 30 may comprise gold, aluminum or copper. During gold ball bonding, a gold ball is first formed by melting the end of the wire through electronic flame-off (EFO). The free-air ball is then brought into contact with the bond pad. Adequate amounts of pressure, heat, and ultrasonic forces are then applied to the ball for a specific amount of time, forming the initial metallurgical weld between the ball and the bond pad as well as deforming the ball bond itself into its final shape. The ball bonding force may range between 100 mN and 1000 mN, typically 200-500 mN.

The wire 30 is then run to the corresponding bond pad 44, forming a gradual arc between the gold pad 24 and the bond pad 44. The bond pad 44 may be formed on the same IC die 10, another die, ceramic substrate, organic substrate, silicon substrate, glass substrate, leadframe or a flexible substrate with only polymer layer. On the bond pad 44, pressure and ultrasonic forces are applied to the wire 30 to form a wedge bond 42. The wirebonding machine or wirebonder breaks the wire in preparation for the next wirebond cycle by clamping the wire and raising the capillary.

It is one salient feature of this invention that the adhesive/barrier layer 22 is very thick and is harder than gold. Therefore it can sustain the stress during wire bonding. The wedge bond can be formed on the gold pad 24 first.

Figure 3:
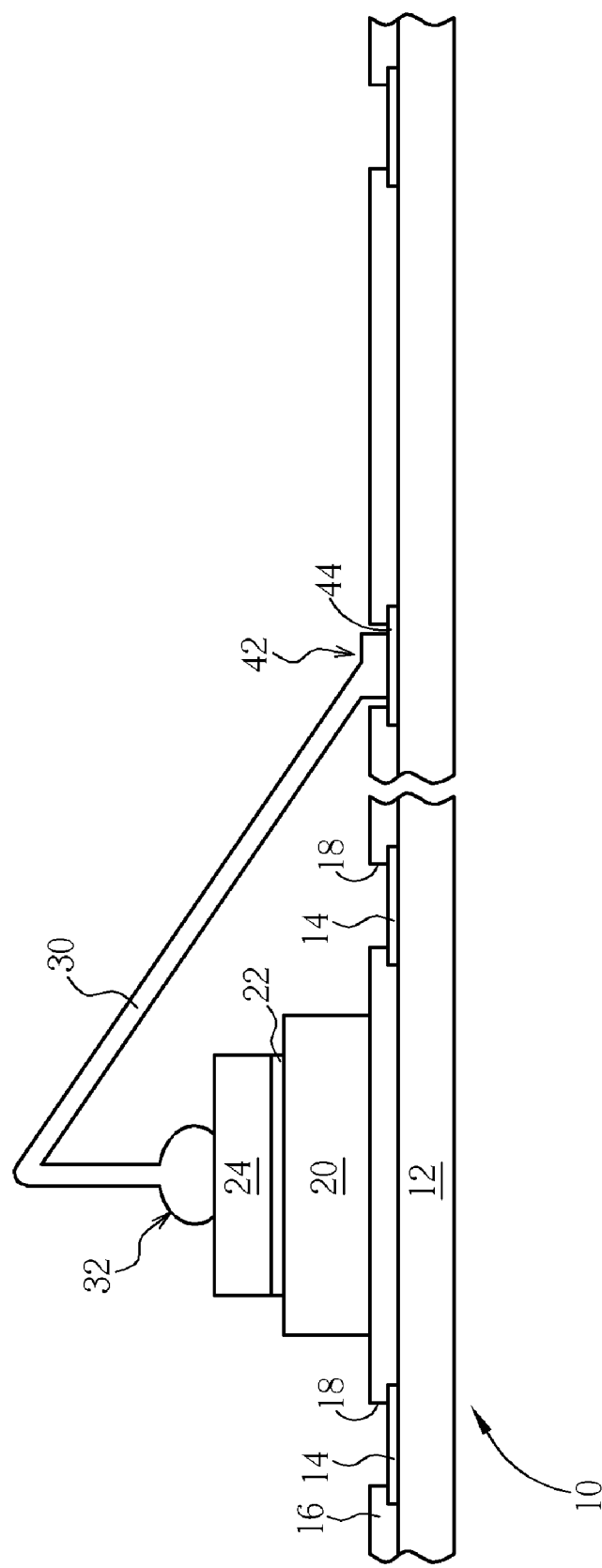
FIG. 3 is a schematic, cross-sectional diagram illustrating the ball-wedge wire bonding with ball bonding on thick gold pad in accordance with the third preferred embodiment of this invention.

Please refer to FIG. 3. FIG. 3 is a schematic, cross-sectional diagram illustrating the ball-wedge wire bonding with ball bonding on thick gold pad in accordance with the third preferred embodiment of this invention.

As shown in FIG. 3, likewise, an IC die 10 is provided. The IC die 10 includes active devices and layers of metal interconnection (not shown) that are fabricated in the substrate layer 12. The active devices such as CMOS, BiCMOS devices, transistors, resistors, capacitors, or inductors are fabricated on a semiconductor substrate such as silicon substrate, GaAs substrate or SiGe substrate.

Multiple inter-layer dielectrics such as low-k dielectric materials, silicon oxide, oxy-nitride are deposited over the semiconductor substrate. The layers of metal interconnection are fabricated in the multiple inter-layer dielectrics by a process comprising sputtering an aluminum layer and then patterning the aluminum layer, or by a process comprising electroplating a copper layer in opening in a dielectric layer and on the dielectric layer and then removing the copper layer outside the opening in the dielectric layer using a CMP process.

On the substrate layer 12, a plurality of bonding pads 14 are formed. A portion of the top surface of each bonding pad 14 is exposed through the respective opening 18 formed in a passivation layer 16 that covers the top surface of the substrate layer 12. According to this invention, the bonding pads 14 includes but not limited to sputtered aluminum pads, CVD aluminum pads, electroplated copper pads, and CVD copper pads. The passivation layer 16 comprises silicon nitride, silicon oxide, silicon oxy-nitride and combinations thereof.

A patterned polymer layer 20 such as polyimide (PI), benzocyclobutene (BCB), or any other suitable organic polymer is provided overlying the passivation layer 16. According to the preferred embodiment of this invention, the polymer layer 20 has a thickness that is greater than 3 micrometers, preferably, 3-100 micrometers, more preferably 8-30 micrometers. In practice, for example, the polymer layer 20 has a thickness of about 3, 8, 13, 20, 23, 28 or 33 micrometers.

On the top surface of the polymer layer 20, an adhesive/barrier layer 22 is provided. The adhesive/barrier layer 22 may include TiW, Ti, Ta, TaN, CrCu, TiN, and the like. According to the preferred embodiment of this invention, the adhesive/barrier layer 22 has a thickness of about 1000 angstroms to 6000 angstroms. Preferably, the adhesive/barrier layer 22 is TiW and has a thickness of about 1500 angstroms to 4500 angstroms.

A gold pad 24 is formed on the adhesive/barrier layer 22. According to the preferred embodiment of this invention, the gold pad 24 has a thickness that is greater than 6 micrometer, preferably, 6-50 micrometers, more preferably 6-20 micrometers. In practice, for example, the gold pad 24 has a thickness of about 6, 8 or 10 micrometers.

Similarly, a wire 30 is bonded onto the gold pad 24 of the IC die 10 to form a ball bond 32. The wire 30 may comprise gold, aluminum or copper. During gold ball bonding, a gold ball is first formed by melting the end of the wire through electronic flame-off (EFO). The free-air ball is then brought into contact with the bond pad. Adequate amounts of pressure, heat, and ultrasonic forces are then applied to the ball for a specific amount of time, forming the initial metallurgical weld between the ball and the bond pad as well as deforming the ball bond itself into its final shape. The ball bonding force may range between 100 mN and 1000 mN, typically 500 mN.

The wire 30 is then run to the corresponding bond pad 44, forming a gradual arc between the gold pad 24 and the bond pad 44. The bond pad 44 may be formed on the same IC die 10, another die, ceramic substrate, organic substrate, silicon substrate, glass substrate, leadframe or a flexible substrate with only polymer layer. On the bond pad 44, pressure and ultrasonic forces are applied to the wire 30 to form a wedge bond 42. The wirebonding machine or wirebonder breaks the wire in preparation for the next wirebond cycle by clamping the wire and raising the capillary.

It is one salient feature of this invention that since the gold pad 24 is very thick, it can sustain the stress during wire bonding. The wedge bond can be formed on the gold pad 24 first.

Figure 4:
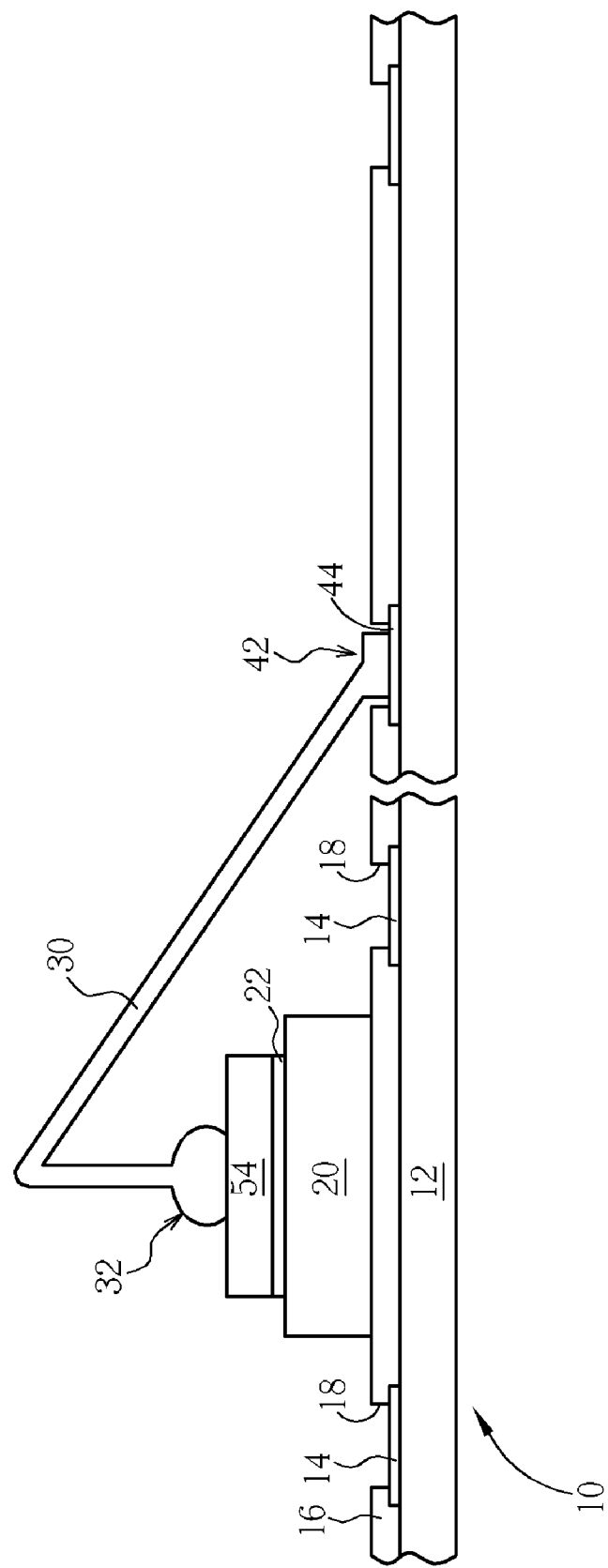
FIG. 4 is a schematic, cross-sectional diagram illustrating the ball-wedge wire bonding with ball bonding on hard metal pad in accordance with the fourth preferred embodiment of this invention.

Please refer to FIG. 4. FIG. 4 is a schematic, cross-sectional diagram illustrating the ball-wedge wire bonding with ball bonding on hard metal pad in accordance with the fourth preferred embodiment of this invention.

As shown in FIG. 4, likewise, an IC die 10 is provided. The IC die 10 includes active devices and layers of metal interconnection (not shown) that are fabricated in the substrate layer 12. The active devices such as CMOS, BiCMOS devices, transistors, resistors, capacitors, or inductors are fabricated on a semiconductor substrate such as silicon substrate, GaAs substrate or SiGe substrate.

Multiple inter-layer dielectrics such as low-k dielectric materials, silicon oxide, oxy-nitride are deposited over the semiconductor substrate. The layers of metal interconnection are fabricated in the multiple inter-layer dielectrics by a process comprising sputtering an aluminum layer and then patterning the aluminum layer, or by a process comprising electroplating a copper layer in opening in a dielectric layer and on the dielectric layer and then removing the copper layer outside the opening in the dielectric layer using a CMP process.

On the substrate layer 12, a plurality of bonding pads 14 are formed. A portion of the top surface of each bonding pad 14 is exposed through the respective opening 18 formed in a passivation layer 16 that covers the top surface of the substrate layer 12. According to this invention, the bonding pads 14 includes but not limited to sputtered aluminum pads, CVD aluminum pads, electroplated copper pads, and CVD copper pads. The passivation layer 16 comprises silicon nitride, silicon oxide, silicon oxy-nitride and combinations thereof.

A patterned polymer layer 20 such as polyimide (PI), benzocyclobutene (BCB), or any other suitable organic polymer is provided overlying the passivation layer 16. According to the preferred embodiment of this invention, the polymer layer 20 has a thickness that is greater than 3 micrometers, preferably, 3-100 micrometers, more preferably 8-30 micrometers. In practice, for example, the polymer layer 20 has a thickness of about 3, 8, 13, 20, 23, 28 or 33 micrometers.

On the top surface of the polymer layer 20, an adhesive/barrier layer 22 is provided. The adhesive/barrier layer 22 may include TiW, Ti, Ta, TaN, CrCu, TiN, and the like. According to the preferred embodiment of this invention, the adhesive/barrier layer 22 has a thickness of about 1000 angstroms to 6000 angstroms. Preferably, the adhesive/barrier layer 22 is TiW.

A hard metal pad 54 such as Ru, Rh, Pt or Ag is formed on the adhesive/barrier layer 22. According to the preferred embodiment of this invention, the hard metal pad 54 has a thickness that is greater than 1000 angstroms, preferably, 1000-10000 angstroms. In practice, for example, the hard metal pad 54 has a thickness of about 3000, 4500 or 6000 angstroms.

A wire 30 is bonded onto the hard metal pad 54 of the IC die 10 to form a ball bond 32. The wire 30 may comprise gold, aluminum or copper. During wire bonding, a ball is first formed by melting the end of the wire through electronic flame-off (EFO). The free-air ball is then brought into contact with the bond pad. Adequate amounts of pressure, heat, and ultrasonic forces are then applied to the ball for a specific amount of time, forming the initial metallurgical weld between the ball and the bond pad as well as deforming the ball bond itself into its final shape. The ball bonding force may range between 100 mN and 1000 mN, typically 500 mN.

The wire 30 is then run to the corresponding bond pad 44, forming a gradual arc between the hard metal pad 54 and the bond pad 44. The bond pad 44 may be formed on the same IC die 10, another die, ceramic substrate, organic substrate, silicon substrate, glass substrate, leadframe or a flexible substrate with only polymer layer. On the bond pad 44, pressure and ultrasonic forces are applied to the wire 30 to form a wedge bond 42. The wirebonding machine or wirebonder breaks the wire in preparation for the next wirebond cycle by clamping the wire and raising the capillary.

It is one salient feature of this invention that the metal pad 54 is made of hard metals such as Ru, Rh, Pt or Ag. Therefore it can sustain the stress during wire bonding. The wedge bond can be formed on the hard metal pad 54 first.

Figure 5:
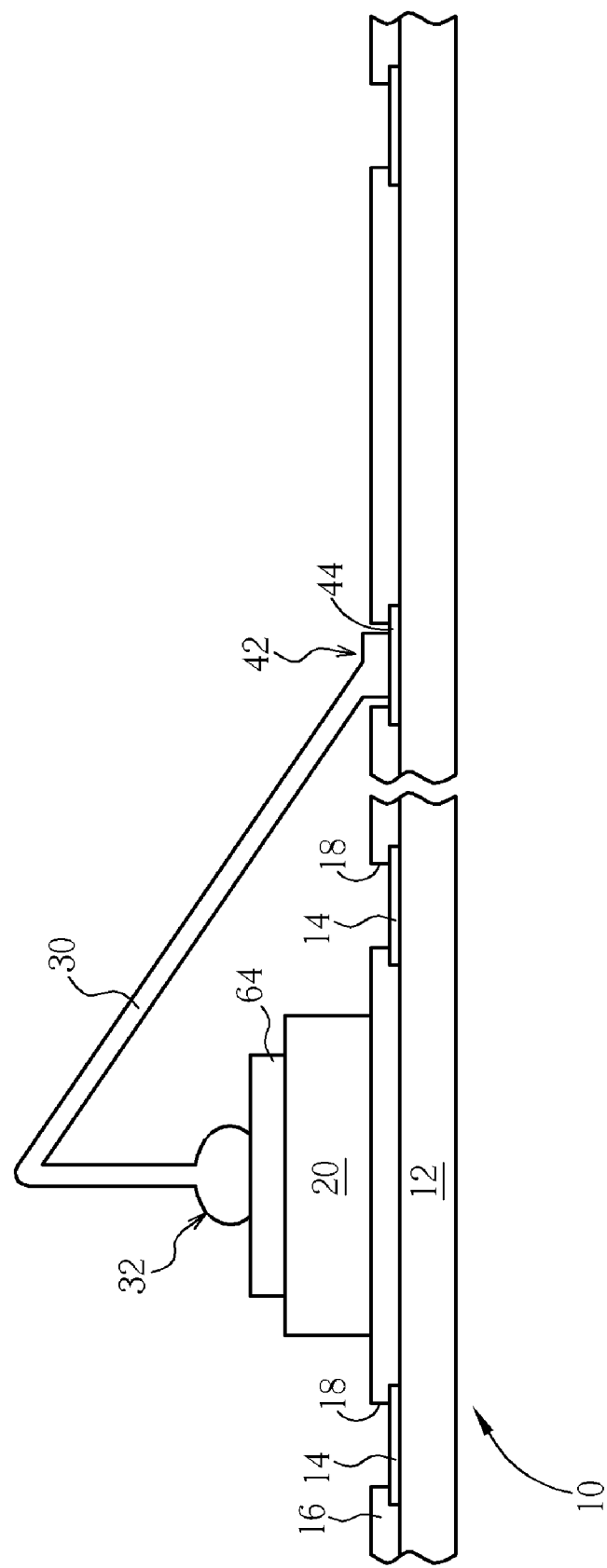
FIG. 5 is a schematic, cross-sectional diagram illustrating the ball-wedge wire bonding with ball bonding on hard metal pad in accordance with the fourth preferred embodiment of this invention.

Please refer to FIG. 5. FIG. 5 is a schematic, cross-sectional diagram illustrating the ball-wedge wire bonding with ball bonding on hard metal pad in accordance with the fourth preferred embodiment of this invention.

As shown in FIG. 5, an IC die 10 includes active devices and layers of metal interconnection (not shown) that are fabricated in the substrate layer 12. The active devices such as CMOS, BiCMOS devices, transistors, resistors, capacitors, or inductors are fabricated on a semiconductor substrate such as silicon substrate, GaAs substrate or SiGe substrate.

Multiple inter-layer dielectrics such as low-k dielectric materials, silicon oxide, oxy-nitride are deposited over the semiconductor substrate. The layers of metal interconnection are fabricated in the multiple inter-layer dielectrics by a process comprising sputtering an aluminum layer and then patterning the aluminum layer, or by a process comprising electroplating a copper layer in opening in a dielectric layer and on the dielectric layer and then removing the copper layer outside the opening in the dielectric layer using a CMP process.

On the substrate layer 12, a plurality of bonding pads 14 are formed. A portion of the top surface of each bonding pad 14 is exposed through the respective opening 18 formed in a passivation layer 16 that covers the top surface of the substrate layer 12. According to this invention, the bonding pads 14 includes but not limited to sputtered aluminum pads, CVD aluminum pads, electroplated copper pads, and CVD copper pads. The passivation layer 16 comprises silicon nitride, silicon oxide, silicon oxy-nitride and combinations thereof.

A patterned polymer layer 20 such as polyimide (PI), benzocyclobutene (BCB), or any other suitable organic polymer is provided overlying the passivation layer 16. According to the preferred embodiment of this invention, the polymer layer 20 has a thickness that is greater than 3 micrometers, preferably, 3-100 micrometers, more preferably 8-30 micrometers. In practice, for example, the polymer layer 20 has a thickness of about 3, 8, 13, 20, 23, 28 or 33 micrometers.

On the top surface of the polymer layer 20, a composite metal pad 64 comprising, from bottom to top, Cr, Cu, Ni and Au is formed on the polymer layer 20. According to the preferred embodiment of this invention, the composite metal pad 64 has Cr thickness ranging between 100 angstroms and 2000 angstroms, preferably 300 angstroms, Cu thickness ranging between 1 micrometer and 10 micrometers, preferably 5 micrometers, Ni thickness ranging between 0.5 micrometer and 5 micrometers, preferably 3 micrometers, and Au thickness ranging between 0.5 micrometers and 2 micrometers, preferably about 1 micrometers.

A wire 30 is bonded onto the composite metal pad 64 of the IC die 10 to form a ball bond 32. The wire 30 may comprise gold, aluminum or copper. During wire bonding, a ball is first formed by melting the end of the wire through electronic flame-off (EFO). The free-air ball is then brought into contact with the bond pad. Adequate amounts of pressure, heat, and ultrasonic forces are then applied to the ball for a specific amount of time, forming the initial metallurgical weld between the ball and the bond pad as well as deforming the ball bond itself into its final shape. The ball bonding force may range between 100 mN and 1000 mN, typically 500 mN.

The wire 30 is then run to the corresponding bond pad 44, forming a gradual arc between the composite metal pad 64 and the bond pad 44. The bond pad 44 may be formed on the same IC die 10, another die, ceramic substrate, organic substrate, silicon substrate, glass substrate, leadframe or a flexible substrate with only polymer layer. On the bond pad 44, pressure and ultrasonic forces are applied to the wire 30 to form a wedge bond 42. The wirebonding machine or wirebonder breaks the wire in preparation for the next wirebond cycle by clamping the wire and raising the capillary.

It is one salient feature of this invention that the adhesive/barrier pad and gold pad are replaced with composite metal pad 64 comprising Cr, Cu, Ni and Au. Since the composite metal pad 6 includes hard metal such as copper, it can sustain the stress during wire bonding. The wedge bond can be formed on the hard metal pad 54 first.

Figure 6:
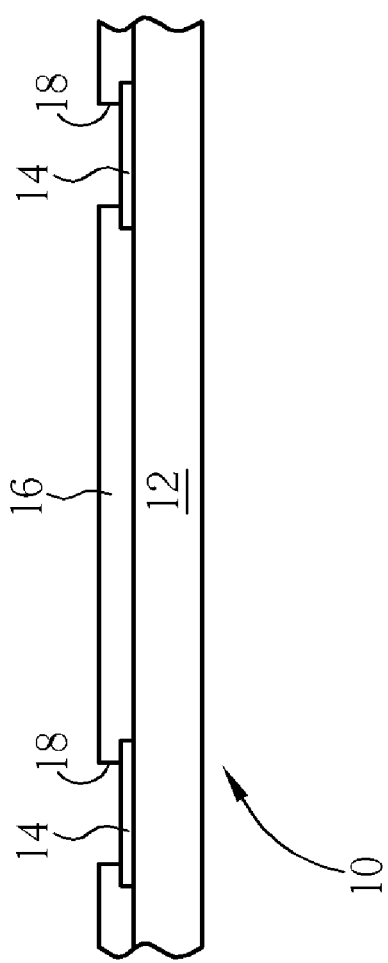
FIGS. 6-12 are schematic, cross-sectional diagrams illustrating the exemplary process of forming the thick polymer layer on passivation of the IC die 10 as set forth in FIGS. 1-5.

FIGS. 6-12 are schematic, cross-sectional diagrams illustrating the exemplary process of forming the thick polymer layer on passivation of the IC die 10 as set forth in FIGS. 1-5, wherein like numeral numbers designate like regions, layers or elements. As shown in FIG. 6, an IC die 10 is provided. The IC die 10 includes active devices and layers of metal interconnection (not shown) that are fabricated in the substrate layer 12. The active devices such as CMOS, BiCMOS devices, transistors, resistors, capacitors, or inductors are fabricated on a semiconductor substrate such as silicon substrate, GaAs substrate or SiGe substrate.

Multiple inter-layer dielectrics such as low-k dielectric materials, silicon oxide, oxy-nitride are deposited over the semiconductor substrate. The layers of metal interconnection are fabricated in the multiple inter-layer dielectrics by a process comprising sputtering an aluminum layer and then patterning the aluminum layer, or by a process comprising electroplating a copper layer in opening in a dielectric layer and on the dielectric layer and then removing the copper layer outside the opening in the dielectric layer using a CMP process.

On the substrate layer 12, a plurality of bonding pads 14 are formed. A portion of the top surface of each bonding pad 14 is exposed through the respective opening 18 formed in a passivation layer 16 that covers the top surface of the substrate layer 12. According to this invention, the bonding pads 14 includes but not limited to sputtered aluminum pads, CVD aluminum pads, electroplated copper pads, and CVD copper pads. The passivation layer 16 comprises silicon nitride, silicon oxide, silicon oxy-nitride and combinations thereof.

Figure 7:
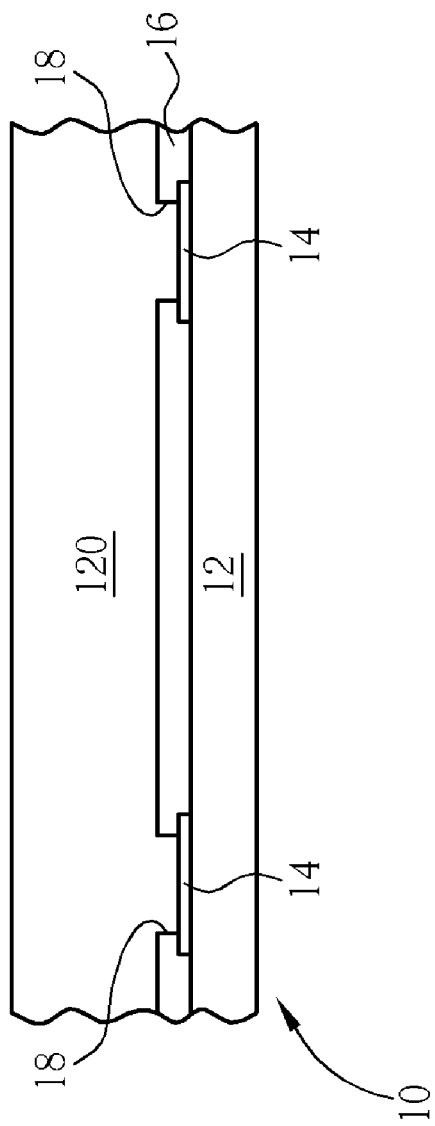

As shown in FIG. 7, a photosensitive polymer layer 120 such as polyimide is coated over the substrate layer 12 and covers the bonding pads 14. The initially coated polymer layer 120 has a thickness of about 20 micrometers. The polymer layer 120 is then subjected to curing process, and its thickness shrinks to about half of original thickness, i.e., about 10 micrometers, after curing.

Figure 8:
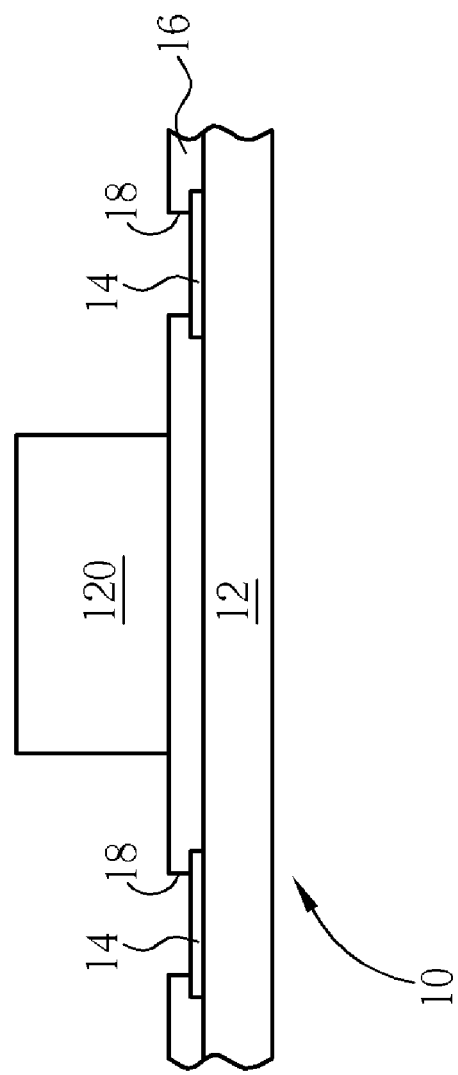

As shown in FIG. 8, a photolithographic process is then carried out to pattern the photosensitive polymer layer 120. The patterned polymer layer 120 is formed on the passivation layer 16. Typically, the photolithographic process includes the steps of, for example, light irradiating, developing and baking.

Figure 9:
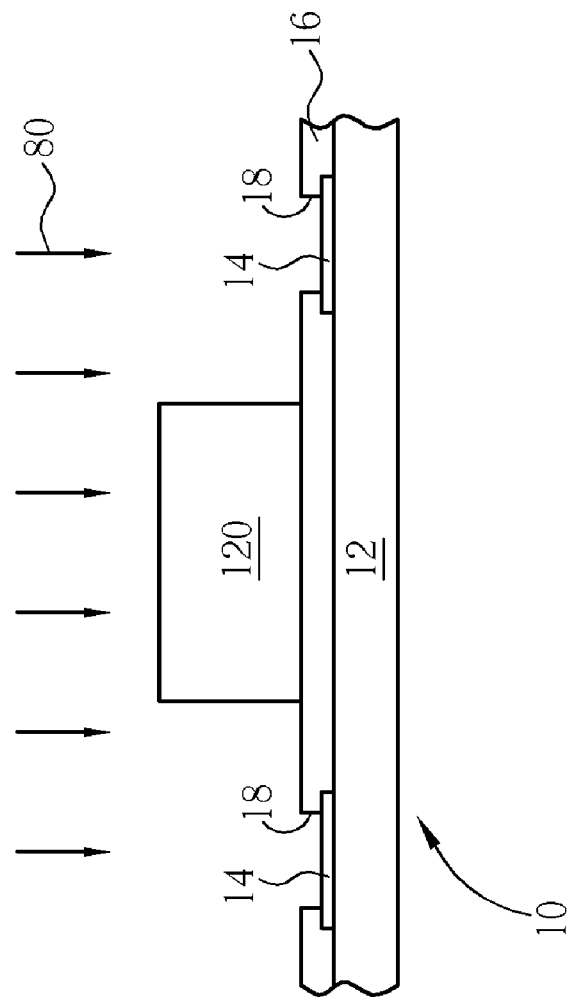

As shown in FIG. 9, a plasma ashing or descuming process 80 utilizing oxygen plasma is performed in order to remove unwanted residual substances from the surface of the bonding pads 14 and from the exposed surface of the passivation layer 16. Preferably, the descuming process employs oxygen plasma or plasma containing other suitable gases such as CF4 having a fluorine concentration of less than 200 ppm (such as 50 ppm or 100 ppm) in order to avoid crystal defect in the aluminum pads induced by plasma bombardment. The crystal defects in the aluminum pads adversely affects the following wire bonding process and the coverage of the sputter film deposited thereon.

Figure 10:
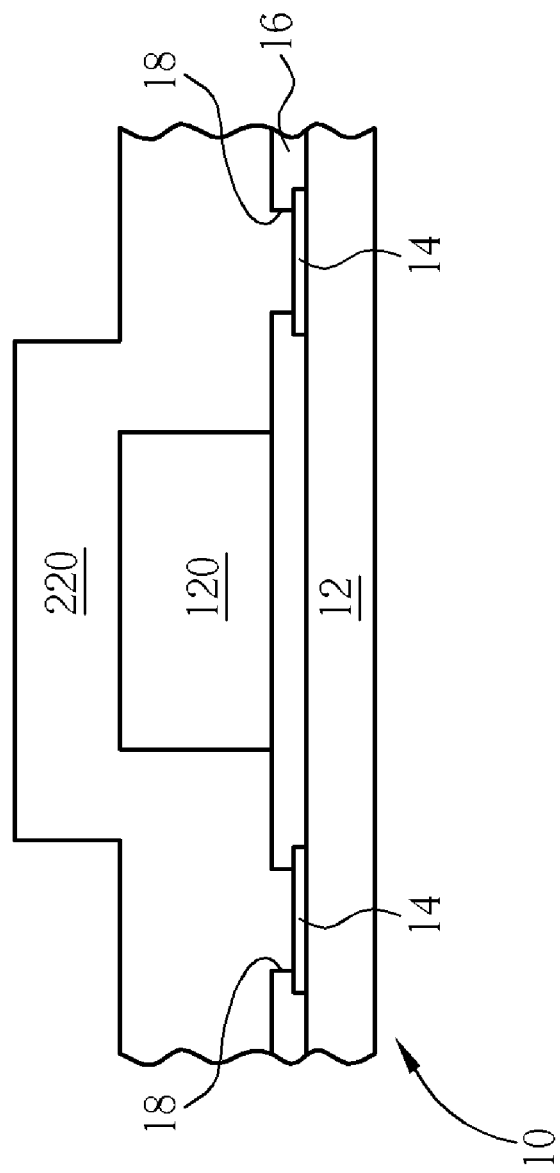

As shown in FIG. 10, subsequently, another photosensitive polymer layer 220, preferably polyimide, is coated over the substrate layer 12 and covers the bonding pads 14 and the patterned polymer layer 120. The initially coated polymer layer 220 has a thickness of about 20 micrometers. The polymer layer 220 is then subjected to curing process, and its thickness shrinks to about half of original thickness, i.e., about 10 micrometers, after curing.

Figure 11:
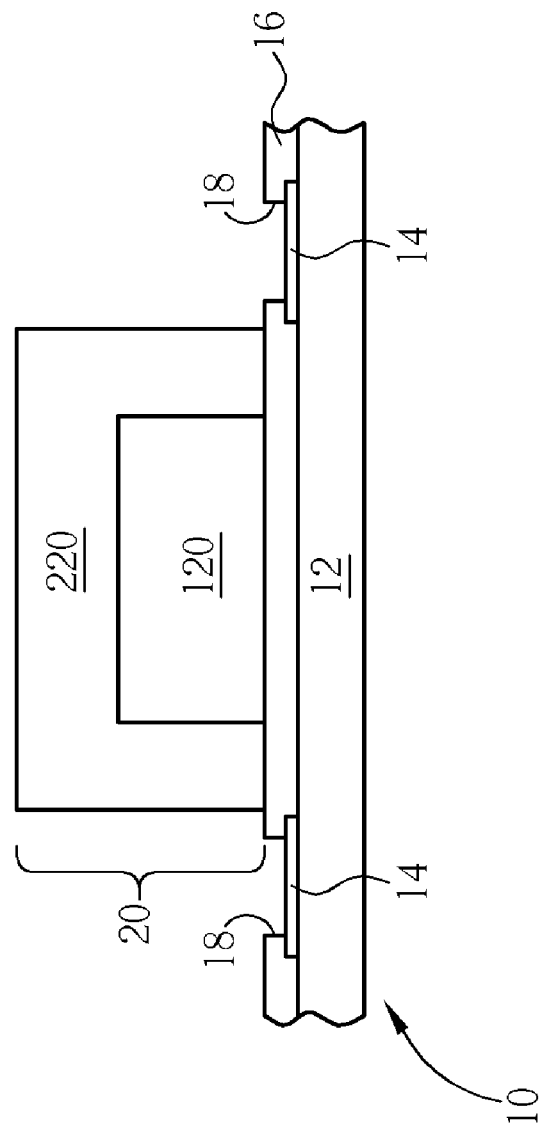

As shown in FIG. 11, a second photolithographic process is then carried out to pattern the photosensitive polymer layer 220. The patterned polymer layer 220 is stacked on the patterned polymer layer 120, forming a thick polymer layer 20 having a thickness of about 20 micrometers.

Figure 12:
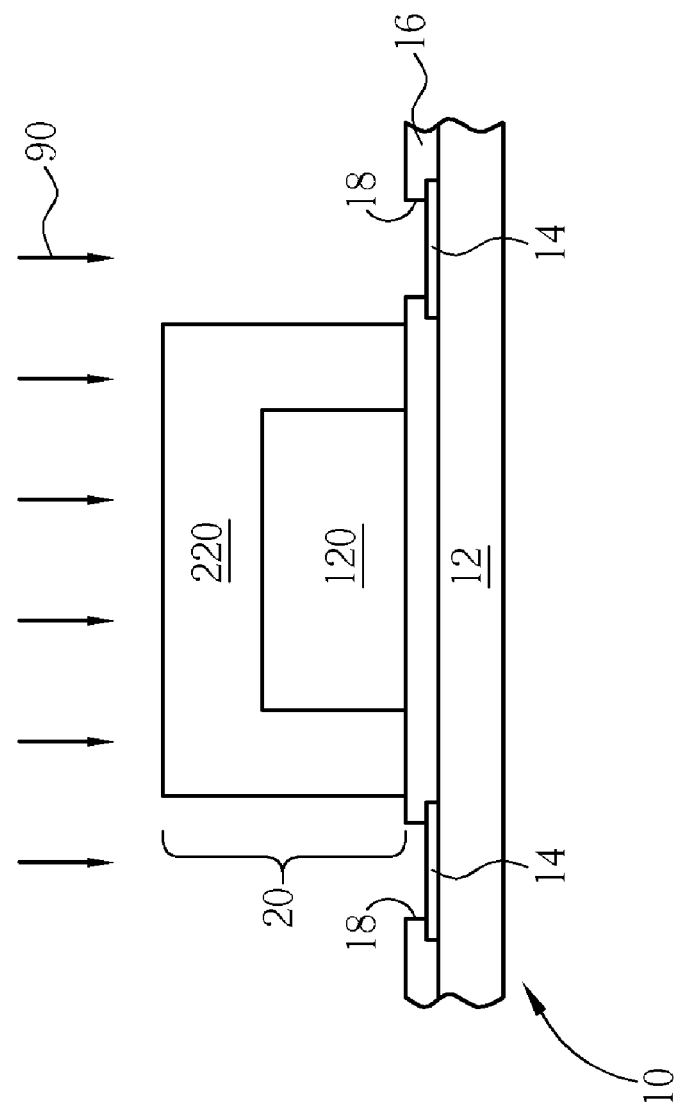

As shown in FIG. 12, a plasma ashing or descuming process 90 utilizing oxygen plasma is performed in order to remove unwanted residual substances from the surface of the bonding pads 14 and from the exposed surface of the passivation layer 16. The steps set forth in FIGS. 5-7 can be repeated to increase the thickness of the polymer layer 20.

The gold bonding pad can be created on top of the thick polymer layer 20 by using conventional embossing Au electroplating method. For example, 3000 angstrom TiW and 1000 angstrom gold are first sputtered over the entire surface of the substrate, then coating photoresist layer (8-30 micrometers), exposure and developing the photoresist layer, electroplating gold on the sputtered Au layer exposed by openings in the photoresist layer, stripping the photoresist layer, etching the sputter Au layer and TiW layer not covered by the electroplated gold to re-expose the aluminum pads or electroplated copper pads in the passivation layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A circuit component comprising:
   an integrated circuit die comprising a MOS device on a silicon substrate, multiple layers of metal interconnection in multiple inter-layer dielectrics over said silicon substrate, wherein said multiple layers of metal interconnection comprise electroplated copper, a gold pad having a thickness between 1 and 50 micrometers, a titanium-containing layer under and in direct physical contact with said gold pad, and a polymer under and in direct physical contact with said titanium-containing layer, wherein said polymer layer has a thickness between 3 and 100 micrometers;

a bonding pad; and a wire comprising a ball bond on said gold pad and a wedge bond on said bonding pad, wherein no opening in said polymer layer is vertically under a contact between said ball bond and said gold pad.

2. The circuit component of claim 1, wherein said bonding pad is on said integrated circuit die.

3. The circuit component of claim 1, wherein said bonding pad is on an organic substrate.

4. The circuit component of claim 1, wherein said bonding pad is on a leadframe.

5. The circuit component of claim 1, wherein said bonding pad is on another integrated circuit die.

6. The circuit component of claim 1, wherein said integrated circuit die further comprises a passivation layer under and in contact with said polymer layer, wherein said passivation layer comprises a nitride.

7. The circuit component of claim 6, wherein said nitride comprises silicon nitride.

8. The circuit component of claim 6, wherein said nitride comprises silicon oxynitride.

9. The circuit component of claim 1, wherein said polymer layer comprises polyimide.

10. The circuit component of claim 1, wherein said thickness of said polymer layer is between 8 and 30 micrometers.

11. The circuit component of claim 1, wherein said thickness of said gold pad is between 2 and 7 micrometers.

12. The circuit component of claim 1, wherein said titanium-containing layer comprises a titanium-tungsten alloy.

13. The circuit component of claim 1, wherein said titanium-containing layer comprises titanium nitride.

14. The circuit component of claim 1, wherein said titanium-containing layer has a thickness between 1000 angstroms and 6000 angstroms.

15. The circuit component of claim 1, wherein said wire comprises gold.

16. The circuit component of claim 1, wherein said integrated circuit die further comprises a silicon-nitride-containing layer under and in contact with said polymer layer.

17. The circuit component of claim 1, wherein said integrated circuit die further comprises a silicon-oxide-containing layer under and in contact with said polymer layer.

18. The circuit component of claim 1, wherein said integrated circuit die further comprises a silicon-oxynitride-containing layer under and in contact with said polymer layer.

19. The circuit component of claim 1, wherein said wire comprises copper.

20. The circuit component of claim 1, wherein said bonding pad is on a glass substrate.

* * * * *